(12) United States Patent
Tanaka et al.

(10) Patent No.: US 7,569,520 B2
(45) Date of Patent: Aug. 4, 2009

(54) METAL SHEATH MAGNESIUM DIBORIDE SUPERCONDUCTING WIRE AND ITS MANUFACTURING METHOD

(75) Inventors: Kazuhide Tanaka, Hitachi (JP); Masaya Takahashi, Hitachi (JP); Michiya Okada, Mito (JP); Hiroaki Kumakura, Tsukuba (JP); Hitoshi Kitaguchi, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 561 days.

(21) Appl. No.: 11/346,317

(22) Filed: Feb. 3, 2006

(65) Prior Publication Data
US 2009/0170710 A1    Jul. 2, 2009

(30) Foreign Application Priority Data
Feb. 4, 2005    (JP) ............................. 2005-029136

(51) Int. Cl.
*H01L 39/24* (2006.01)
*H01L 39/14* (2006.01)

(52) U.S. Cl. .................... 505/100; 505/150; 505/230; 505/704

(58) Field of Classification Search ................ 505/100, 505/150, 231, 704
See application file for complete search history.

(56) References Cited

U.S. PATENT DOCUMENTS

2003/0207765 A1 * 11/2003 Bower et al. ................ 505/100
2004/0116301 A1 * 6/2004 Tallon et al. ................ 505/100

FOREIGN PATENT DOCUMENTS

| JP | 2002-373534 | | 12/2002 |
| JP | 2002373534 A | * | 12/2002 |
| JP | 2003031057 A | * | 1/2003 |

OTHER PUBLICATIONS

JP 2002373534 A (English Machine translated version).*
JP 2003031057 A(English Machine translated version).*

* cited by examiner

*Primary Examiner*—Jerry Lorengo
*Assistant Examiner*—Joseph V Micali
(74) *Attorney, Agent, or Firm*—Antonelli, Terry, Stout & Kraus, LLP.

(57) ABSTRACT

In a metal sheath $MgB_2$ superconducting wire, it is intended to achieve a wire having increased current density and a long length at the same time, by densitying superconducting core part. The superconducting wire is manufactured by forming diffusion hardened layer on the inner surface of the sheath such that the hardness of the inner surface becomes higher than that of the outer surface, filling $MgB_2$ superconductor, and further if necessary, a critical current density increasing material such as indium, copper, and tin, in a metal sheath, to subject it to wire drawing. For the metal sheath, a material with toughness such as steel is used. Even if the sheath is made to a long wire, it does not break, thereby, enabling to density superconducting core part.

9 Claims, 3 Drawing Sheets

METAL SHEATH MAGNESIUM DIBORIDE SUPERCONDUCTING WIRE AND ITS MANUFACTURING METHOD

FIELD OF THE INVENTION

The present invention relates to a superconducting wire in which a superconductor comprising magnesium diboride (hereinafter abbreviated as $MgB_2$) is included in a metal sheath, and its manufacturing method. The present invention also relates to a superconducting multicore wire comprising a plurality of twisted metal sheath $MgB_2$ superconducting wires.

The superconducting wire of the present invention can be applied to a current lead, a power transmission cable, a large-size magnet, a nuclear magnetic resonance analysis system, a clinical magnetic resonance imaging system, a superconducting power storage system, a magnetic separation system, a single crystal pulling apparatus in a magnetic field, a refrigerator-cooled superconducting magnet system, a superconducting energy storage system, a superconducting generator, further, a fusion reactor magnet, or the like.

BACKGROUND OF THE INVENTION

Conventionally, as for a superconducting material, metal based or oxide based material is known. Typical metal based superconducting materials are niobium titanium (NbTi), niobium-3 tin (Nb3Sn), niobium-3 germanium (Nb3Ge), or the like. However, among the metal based superconducting materials, even for niobium-3 germanium (Nb3Ge), the critical temperature is 23 K (Kelvin), thereby, there is a problem that expensive liquid helium have to be used for cooling.

As for an oxide based superconducting material, since lanthanum (La) oxide based superconducting material of critical temperature 30 K has been discovered, copper oxide based materials having critical temperature above the boiling temperature of nitrogen (77 K) are discovered in succession. The typical copper oxide based superconducting materials are yttrium (Y), bismuth (Bi), thallium (Tl), and mercury (Hg) based material, and the like. However, since the copper oxide based superconducting material is so-called ceramics, there is a problem that, because of its poor workability, it is difficult to make it a wire having excellent homogeneity in long-wire. The copper oxide based superconducting material also has large magnetic anisotropy, thereby it is required to align between the crystal orientations of a substrate or the sheath material and the superconducting phase. The work for aligning crystal orientations is very difficult, thereby, there is also a problem in yield or cost.

In 21st century, it has been discovered that $MgB_2$ reveals superconductivity at 39 K. Since $MgB_2$ has quite small magnetic field anisotropy, it is possible to attain high critical current density even if its crystal orientation is not aligned to the same orientation of the sheath material as the copper oxide based superconducting material.

Moreover, $MgB_2$ has a critical temperature as higher as 20 K or more than that of the metal based conductive material. It is also reported that the upper critical magnetic field of $MgB_2$ is about 40 T in a thin film. If these properties are utilized, it will be realistic for application under cooling of a refrigerator, or in a strong magnetic field.

It has been recognized that $MgB_2$ has practically very effective features in that it can be made into a wire by a powder-in-tube method, and moreover, it is possible to attain practical critical current density even by mechanical processing only (See, for example; JP-A-2002-373534, abstract and paragraph [0028]). Thus, it means that high superconducting property can be attained without any heat processing. The feature is absolutely different from the conventional superconducting wire, in which superconductivity phenomena does not appear without heat processing. Since shortening of a manufacturing process, enlarging the degree of the selectivity of metal sheath material, and improving the degree of freedom for coil winding and designing are achieved by utilizing the features, it is considered that significant cost reduction can be achieved as compared to the conventional superconducting material.

BRIEF SUMMARY OF THE INVENTION

In a metal sheath $MgB_2$ superconducting wire, in order to attain a high critical current density without heat processing, it is required to enhance the density of a $MgB_2$ superconductor, which is a superconducting core part. This is due to the fact that current path is ensured by only the bindings between $MgB_2$ particles. In order to attain a high density superconducting core part, it is desirable to use a high hardness material for the metal sheath.

On the contrary, considering the application of $MgB_2$ wire to a superconducting magnet or the like, the wire is required to have improved critical current density and a long length.

In metal sheath $MgB_2$ superconducting wire, there are problems that, when a high hardness material is used for the metal sheath, it is difficult to attain a long wire, and when a low hardness material is used, it is difficult to attain a high density superconducting core part.

The object of the present invention is to achieve both of a high density of the superconducting core part for achieving a high critical current density, and a long wire, in a metal sheath $MgB_2$ superconducting wire.

Other objects, features and advantages of the invention will become apparent from the following description of the embodiments of the invention taken in conjunction with the accompanying drawings.

DESCRIPTION OF REFERENCE NUMERALS

1: superconducting wire, 2: metal sheath, 3: $MgB_2$ superconductor, 4: round rod made of copper, 5: twisted wire, 6: metal sheath for multicore, 7: superconducting multicore wire.

DETAILED DESCRIPTION OF THE INVENTION

The feature of the present invention is to cause the hardness of the inner surface the metal sheath to be larger than that of the outer surface, in a metal sheath $MgB_2$ superconducting wire.

In addition, the manufacturing method of a metal sheath $MgB_2$ superconducting wire, in which a tubular metal sheath is filled with $MgB_2$, after then, it is subjected to wire drawing, is intended to subject the sheath to wire drawing by using a metal sheath of which hardness is higher on inner surface than on the outer surface, or after causing the hardness on the inner surface higher than that on outer surface.

According to the present invention, a metal sheath $MgB_2$ superconducting wire having a high critical current density and a long size at the same time, can be achieved.

The present invention is intended to enable such a metal sheath which has high density superconducting core part and a long size, and to attain high critical current density in a long wire, by causing the outer surface of a metal sheath to be easily drawn while withstanding in a hard working process, on the other hand by causing the inner surface of the metal sheath harder.

It is desirable to use a steel such as a chrome molybdenum steel or a stainless steel as the material of the metal sheath. In addition, especially, it is desirable to use a material having Vickers hardness 400 or less. This is because, if a material having Vickers hardness more than 400 is used as the sheath material, it is empirically hard to make it long size.

In order to cause the hardness of the inner surface of the metal sheath to be higher than that of the outer surface, it is desirable to subject the sheath material to diffusion hardening processing, especially surface processing such as nitriding or carburizing, to form a diffusion hardened layer on the inner surface of the sheath.

As nitriding process, known processes such as radical nitriding, gas nitriding, ion nitriding, salt bath nitriding, gas nitrocarburizing, and salt bath nitrocarburizing can be utilized. In addition, as a carburizing process, known processes such as gas carburizing, vacuum carburizing, and plasma carburizing, can be utilized. By these surface processings, a nitrided layer or a carburized layer due to carbon diffusion, are formed on the inner surface of the sheath, thereby, hardening the inner surface.

As another process for forming a hardened layer on the inner surface of the sheath, electroplating, cladding, or the like may be considered, however, they are inadequate, because a dual layer structure consisted of a sheath material and the electroplating or a cladding material is made, thereby, cracks may easily occur at the bonding plane during wire drawing. It is desirable to change the hardness gradually by forming a diffusion hardened layer on the sheath material.

The superconducting wire of the present invention, can include at least one kind of metal selected from the metals consisting of copper, indium, tin, lead, iron, aluminum, magnesium, titanium, and tungsten. It can also include at least one kind of ceramics selected from the ceramics consisting of silicon oxide, silicon carbide, and silicon nitride. It is desirable for these mixed materials to be in an amount of 0.2-30 volume %. By including these mixed materials, the bondability between crystal grains is increased, and the critical current density is caused higher. It is more effective, if $MgB_2$ and the mixed materials are caused to be small to fill in the sheath, such that their particle diameters become to a nanometer order.

The superconducting wire of the present invention can be used by making a multicore wire. In the situation, the multicore wire is made, by preparing plurality of superconducting wires of the present invention, twisting them to a twisted wire, and further including the twisted wire in a metal sheath. It is also desirable to form a diffusion hardened layer on the inner surface of the metal sheath including the twisted wire.

The superconducting wire of the present invention is also excellent in bending property, thereby, even if a distortion of 1.5% is applied to the superconducting wire, it can maintain the critical current density of 90% or more with respect to that of the wire without distortion.

The superconducting wire of the present invention has practical critical current density, however, in order to attain higher critical current density, it is desirable to subject it to heat processing. In the situation, extremely high critical current density is attained, when the heat processing is performed within a range of 200-1200° C., and if necessary, under an ambient gas, which is nitrogen gas, argon gas, hydrogen gas, oxygen gas, or the mixtures thereof, or under a pressure of atmospheric pressure or more. Since the metal sheath material is annealed by the heat processing, it is effective during making a long wire.

It is most effective to cause $MgB_2$ and a mixed material to be small powders to fill them in a sheath, however, it is also possible to fill the sheath with cylindrical or square rod formed by pressing etc. For example, it is possible to use the mixture of $MgB_2$ and the mixed material, by pulverizing them to a suitable size or by sintering them, or, it is also possible to use a compact of $MgB_2$ powder and the mixed material powder.

In an usual situation, at the stage before being processed into a wire, the thickness of the metal sheath is several millimeter order, in particular, 4-5 mm. In this manner, because the thickness of the sheath is not so large, if, by wire drawing, the hardness of the superconducting core part is caused to be higher than that of the inner surface of the sheath, the smoothness of the interface between the sheath part and the superconducting core part is lost, thereby so called sausaging occurs, resulting in the phenomenon that at a higher reduction, the superconducting core part bursts through the metal sheath to be exposed. Therefore, ideally, it is desirable to cause the Vickers hardness of the sheath material to satisfy the relation, $SHv \geqq CHv$, where the Vickers hardness of the sheath material is denoted by SHv, and the Vickers hardness of the superconducting core part is denoted by CHv.

As diameter reducing processing for making a wire, using a drawbench, a hydrostatic extruder, a swagger, cassette roller dies, or a grooved roll or the like, wire drawing processing having the cross-sectional reduction rate per one pass of 1-20% order, may be performed repeatedly. In addition, if necessary, a multicore wire is made, and as the method for making the multicore wire, a method may be performed, in which a wire material drawn in a round sectional shape or a hexagonal sectional shape is assembled in a pipe, and using above mentioned processing machine, the cross-sectional reduction rate per one pass is made to 1-20% order, and diameter reducing processing is performed until a desired wire radius is attained.

These diameter reducing processing have an effect to cause the wire material is to be in a desired shape, and at the same time, to cause the superconducting material filled in the metal sheath to have a high density. A cold or hot rolling mill may be used for the processing in order to achieve a more densified superconducting material, which provides extremely increased critical current density.

It is possible to attain equivalent superconductivity even when a wire is used, which is produced by processes other than those above such as, for example, thermal spraying, doctor blade process, dip coating, spray pyrolysis process, or jelly roll process.

The superconducting wire according to the present invention can be used by winding plurality of bundled wires in a coil shape, or by forming it in a lead wire shape or a cable wire shape or the like, depending on the purpose of use.

In addition, in the superconducting wire according to the present invention, since a superconducting wire using a steel such as a chrome molybdenum steel or a stainless steel as the material of the metal sheath, has high toughness and high hardness, a magnet which has high mechanical strength such as yield stress, tensile strength, and Young's modulus, and can withstand the electromagnetic force when strong magnetic field occurs, can be configured. Further, by reducing a resistance between both electrodes to an enough small level, a permanent current magnet can be achieved.

If the superconducting wire according to the present invention is used, for example, in liquid helium, by combining to a metal based superconductor, or an oxide based superconductor, a practical conductor such as a superconducting magnet generating stronger magnetic field, can be achieved. As the metal based superconductor in this case, NbTi based alloy, $Nb_3Sn$ based compound, $Nb_3Al$ based compound, V3Ga based compound, Chevrel based compound, or the like are preferable. In addition, as the oxide based superconductor, Y based, Bi based, Tl based, Hg based, and Ag—Pb based superconductors are preferable. If necessary, more than two kinds of magnets can be arranged.

In addition, if the superconducting wire according to the present invention is used in liquid hydrogen or liquid neon, by combining to an oxide based superconductor, a practical conductor such as a superconducting magnet having higher performance, can be achieved.

Besides for the superconducting magnet, the superconducting wire according to the present invention, can be used for a power transmission cable, a current lead, an MRI system, an NMR system, an SMES system, a superconducting generator, a superconducting motor, a superconducting electromagnetic propulsion ship, a superconducting transformer, a superconductive current-limiter, or the like, can be used.

In addition, a conductor that is a superconducting wire processed in a desired shape is assembled in various kinds of available equipment, after deformation processing to a conductor for a coil, a current lead, a cable, or the like. If the working temperature of the equipment is the liquid hydrogen or neon temperature or more, the conductor is more effective.

Now, using examples, the present invention will be described in detail, however, it is not intended to be limited by the following examples.

EXAMPLE 1

The inner surface of a tubular SCM415 (chromium-molybdenum steel) sheath was nitrided by radical nitriding, which has an outer diameter of 15 mm, inner diameter of 11 mm, and length of 100 mm. During nitriding, a stainless steel pipe having inner diameter of 11.1 mm was disposed on the edge surface of the SCM415 sheath so as to expose the inner side of the stainless steel pipe to a nitriding atmosphere. The distribution of Vickers hardness of the SCM 415 sheath after nitriding, is shown in Table 1.

TABLE 1

|  | outer surface | central part | inner surface |
|---|---|---|---|
| Sheath after radical nitriding | 200 | 500 | 750 |

Vickers hardness on the outer surface of the sheath was that of the sheath material, because the outer surface was not nitrided. Vickers hardness on the inner surface of the sheath was increased to 750 due to the effect of nitriding.

Figure 1:
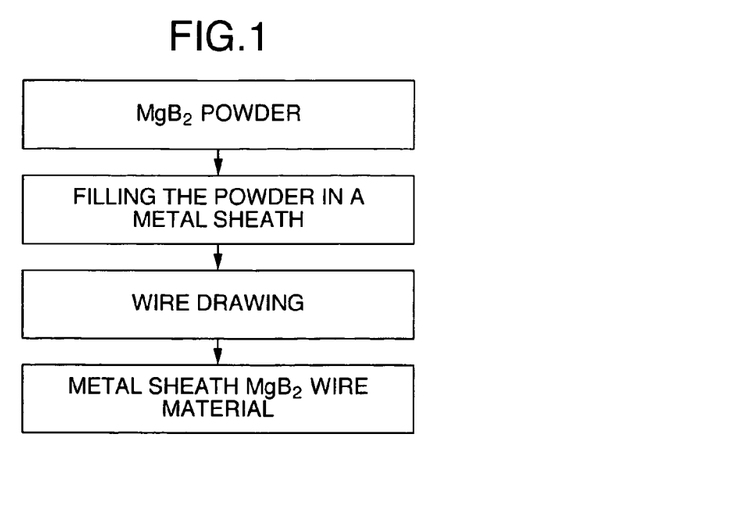
FIG. 1 is a view showing an example of the process for manufacturing the superconducting wire according to the present invention.

Next, $MgB_2$ powder was filled in the sheath. After then, wire drawing was repeated such that sectional reducing rate per one pass became within a range of 1-20%, to reduce a diameter to a predetermined size. According to this example, a superconducting wire having thickness of 0.4 mm and width of 2.5 mm was attained. The manufacturing process according to the manufacturing method is shown in FIG. 1

Figure 2:
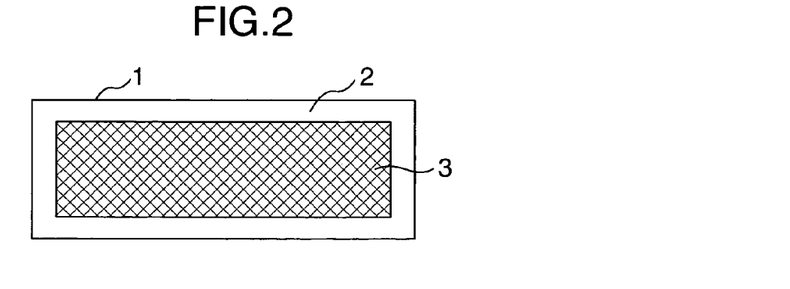
FIG. 2 is a schematic sectional view of the superconducting wire according to the present invention.

The schematic sectional view of the produced superconducting wire 1 is shown in FIG. 2. $MgB_2$ superconductor 3 is included in the inside of the metal sheath 2. In this example, the cross sectional shape of the wire is rectangular, however, it is not limited to the shape, it may be square, polygonal such as hexagonal, spherical, ellipstical, plain rectangular, or tape-like shape. In addition, for comparison, using SCM415 sheath without nitriding, a superconducting wire having similar size and shape was produced.

The distributions of Vickers hardness of the superconducting wire in the final state according to the present invention, and the superconducting wire in the final state according to the comparative example, are shown in Table 2.

TABLE 2

|  | outer surface | central part | inner surface | superconducting core | critical current density (4.2 K, 0.5 T) |
|---|---|---|---|---|---|
| with nitriding | 440 | 810 | 930 | 780 | 2800 A/mm² |
| without nitriding | 440 | 445 | 435 | 415 | 950 A/mm² |

The Vickers hardnesses of the metal sheath of the wire according to the present invention, were 440 on the outer surface, 810 on the central part, and 930 on the inner surface. On the contrary, the Vickers hardnesses of the metal sheath of the wire according to the comparative example without nitriding, were 440 on the outer surface, 445 on the central part, and 435 on the inner surface. In addition, Vickers hardnesses of $MgB_2$ according to the present invention, were 780, and that of according to the comparative example were 415. In this manner, by nitriding the inner surface of the metal sheath to harden it, the superconducting core part can be densified. In addition, the reason of the fact that Vickers hardness of the sheath material after wire drawing increased than that of the sheath material before wire drawing, is due to the work hardening of the sheath material.

Figure 3:
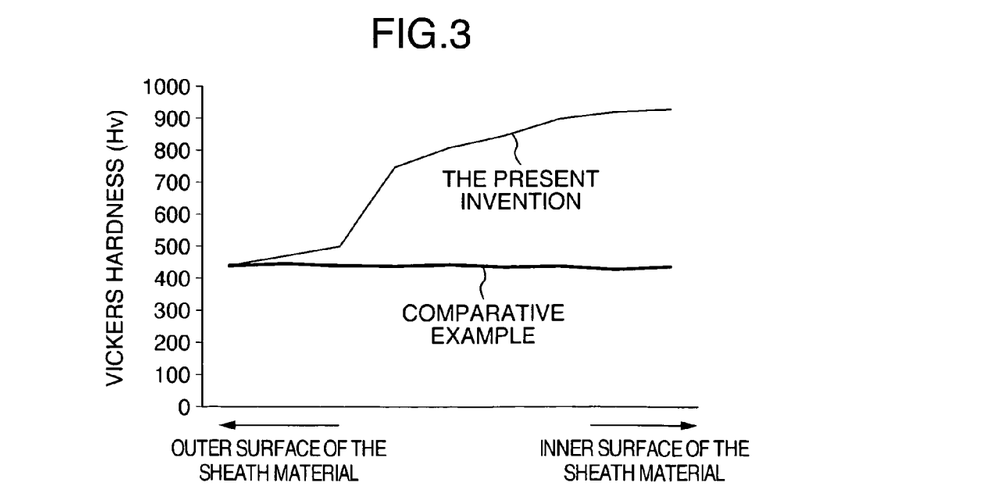
FIG. 3 is a view showing the distributions of Vickers hardness in the thickness direction of the sheath for the superconducting wire according to the present invention, and for the wire according to a comparative example.

In FIG. 3, distributions of the Vickers hardness of the metal sheath of the superconducting wire of the present invention, and the Vickers hardness of the metal sheath of the superconducting wire of the comparative example, are shown. It was confirmed that the hardness of the comparative example was substantially constant from the outer surface to the inner surface of the sheath material, however, that of the present invention had large distribution from the outer surface to the inner surface.

As the result of measuring the critical temperatures for the superconducting wires of the present invention and the comparative example using DC four-terminal method, it was known that both of them became in a superconducting state at 37 K. Next, the critical current density of each wire was measured at a temperature of 4.2 K, and in a magnetic filed of 0.5 T. As the result, as shown in Table (2), that of the present invention was attained to a value of 2800 A/mm$^2$, however, that of the comparative example was 950 A/mm$^2$.

Figure 4:
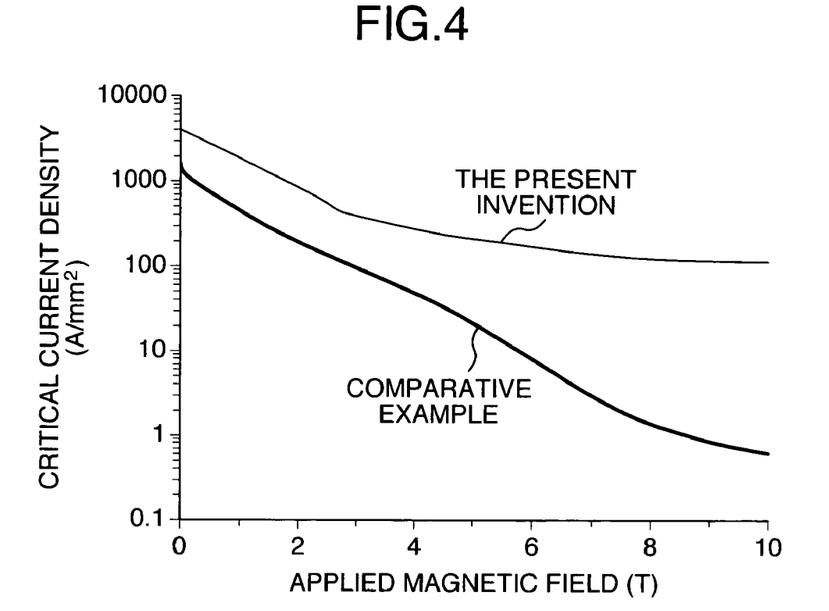
FIG. 4 is a view showing the relations between an applied magnetic field and critical current density for the superconducting wire according to the present invention, and for a wire according to a comparative example.

In addition, the magnetic field dependence of the critical current density was measured. As the result, as shown in FIG. 4, it was known that the reduction rate of the critical current density with respect to the magnetic filed was smaller for the nitrided superconducting wire of the present invention than for the unnitrided superconducting wire. This is considered due to the fact that the superconducting core part was densified, thereby increasing bonding force between powder particles. Therefore, it is considered that the increase of the bonding force is also linked to the increase of the current paths.

As mentioned above, it was made clear that nitriding the inner surface of the sheath to enhance the hardness is effective for the increase of the critical current density of the superconducting wire.

For comparing to the wire of the present invention, using tungsten carbide having Vickers hardness above 900 as the sheath material, production of wire was tried in the same process as in FIG. 1. However, when the reduction became above 30%, check or crack occurred on the surface of the wire, and when the wire was drawn to a diameter in which the reduction became above 50%, breaking occurred frequently. By investigating the feature of the ruptured part, the angle of the ruptured surface was nearly 45° C., thereby, it was considered as a general rupture. Therefore, it is considered that the rupture occurred due to the limit of the elongation of the material itself. Thus, it was known that it is necessary for attaining a long wire and high density superconducting core part to use a material as the sheath material, which has excellent toughness and is easily processed, and to harden the inner surface of the sheath material.

EXAMPLE 2

Using SCM415 and SUS420J2 (martensitic stainless steel of 13Cr-0.3C, Vickers hardness: 400 or less) (outer diameter: 18 mm, inner diameter: 13 mm, length: 200 mm) as a sheath material, respectively, the inner surface of the sheath was nitrided by radical nitriding. In order to confirm the effect of masking, the nitriding was performed to a material using a masking material and a material without using masking material. In addition, as the masking material, SUS pipe was used, and similar to the case of example 1, the masking material was arranged on the edge face of the sheath such that the inner surface of the sheath was exposed to a nitriding atmosphere. MgB$_2$ powder was filled in the sheath nitrided in this manner, and wire drawing was performed repeatedly such that reduction rate of the cross sectional area became with in the range of 3-15%. As the result, as shown in Table 3, when the masking material was present, with either metal sheath, the processing could be performed until the outer diameter became to 1.0 mm, however, the metal sheathes without masking material were broken at a radius of which reduction became approximately to 75%.

As mentioned above, it was known that for maintaining the workability of wire and attaining a long wire, it was preferable to perform nitriding only on the inner surface of the sheath.

TABLE 3

|  | SCM415 | SUS420J2 |
| --- | --- | --- |
| without masking | broken at outer diameter of 8.8 mm | broken at outer diameter of 9.1 mm |
| with masking | not broken until outer diameter of 1.0 mm | not broken until outer diameter of 1.0 mm |

EXAMPLE 3

The inner surface of tubular SCM415 sheath (outer diameter: 15 mm, inner diameter: 11 mm, length: 100 mm) was hardened by radical nitriding, ion nitriding, gas nitriding, salt bath nitriding, vacuum carburizing, plasma carburizing, and gas carburizing. In addition, as a masking material, SUS pipe (outer diameter: 15 mm, inner diameter: 11.1 mm) was used. As the result, similar to the case of radical nitriding of example 1, it was confirmed that the outer surface of the sheath was not hardened, and only the inner surface of the sheath was hardened.

EXAMPLE 4

The inner surface of tubular SCM415 sheath (outer diameter: 15 mm, inner diameter: 11 mm, length: 100 mm) was nitrided by radical nitriding. During nitriding, SUS pipe (outer diameter: 15 mm, inner diameter: 11.1 mm) was placed on the edge face of the sheath as a masking material such that the inner surface of the sheath was nitrided. The sheath was filled with MgB$_2$ powder and indium powder, and subjected to wire drawing to be processed to a wire. In Table 4, indium loadings and critical current density of the wire are shown. From the table, it was known that, when indium loadings is 0.1-32 vol %, critical current density of the wire became higher than that of the wire without indium loading. Especially, the indium loadings is preferable to be within a range of 0.2-30 vol %.

TABLE 4

| loadings of Indium (vol %) | 0 | 0.1 | 0.2 | 0.5 | 1 | 2 | 5 | 10 | 20 |
| --- | --- | --- | --- | --- | --- | --- | --- | --- | --- |
| critical current density | 1500 A/mm$^2$ | 1700 A/mm$^2$ | 2750 A/mm$^2$ | 2750 A/mm$^2$ | 2680 A/mm$^2$ | 2800 A/mm$^2$ | 2750 A/mm$^2$ | 2900 A/mm$^2$ | 2900 A/mm$^2$ |

TABLE 4-continued

| (4.2 K, 0.5 T) loadings of Indium (vol %) | 25 | 28 | 30 | 32 | 35 | 40 | 50 |
|---|---|---|---|---|---|---|---|
| critical current density (4.2 K, 0.5 T) | 2800 A/mm$^2$ | 2750 A/mm$^2$ | 2700 A/mm$^2$ | 1600 A/mm$^2$ | 1000 A/mm$^2$ | 400 A/mm$^2$ | 50 A/mm$^2$ |

Moreover, it was known that the critical current density increased further by pulverizing and mixing indium metal and MgB$_2$ powder by a ball mill.

In addition, besides indium, even when copper, tin, lead, iron, aluminum, magnesium, titanium, tungsten, silicon oxide, silicon carbide, silicon nitride, or the like were added alone or in a mixture thereof, wires were manufactured and their critical current density were measured. As the result, in either case, when they were mixed within a range of 0.2-30 vol %, the critical current density increased.

EXAMPLE 5

SUS420J2 sheath (outer diameter: 10 mm, inner diameter: 7.5 mm, length: 200 mm) and various kinds of stainless steel sheaths were processed by nitriding on their inner surface under various conditions, and subjected to wire drawing, and finally a superconducting wire having a rectangular cross section (thickness: 0.4 mm, width: 2.5 mm) was produced. The sheath materials except SUS420J2 were SUS304, SUS304L, SUS310S, and SUS316L. As nitriding conditions, processing temperature of 400-700° C., processing time of 0.5-5 hours, relative proportions of gas: N$_2$/H$_2$/Ar=1/1/10, and gas pressure of 500-2000 Pa were used, and by changing conditions within these ranges, Vickers hardness of the inner surface of the sheath material after wire processing, were arbitrarily changed within a range of 450-1030.

As for the case in which SUS420J2 is used, Vickers hardness of the inner surface of the sheath material after final processing, and critical current density of the wire at a temperature of 4.2 K, and in a magnetic field of 0.5 T are shown in Table 5.

As the hardness of the inner surface of the sheath after final processing increases, the critical current density increases. Particularly, it was known that, when the Vickers hardness of the inner surface of the sheath became above 600, the increase of the critical current density was apparent.

Since, even when the material of the sheath material was changed, similar tendency was shown, in order to attain high critical current density, it is effective to cause Vickers hardness of the inner surface of the sheath material after final processing to be 600 or more.

TABLE 5

| vickers hardness on inner surface of sheath material | 450 | 550 | 575 | 600 | 625 | 675 | 760 | 880 | 1030 |
|---|---|---|---|---|---|---|---|---|---|
| critical current density (4.2 K, 0.2 T) | 1200 A/mm$^2$ | 1550 A/mm$^2$ | 1900 A/mm$^2$ | 2620 A/mm$^2$ | 2750 A/mm$^2$ | 2900 A/mm$^2$ | 2850 A/mm$^2$ | 2800 A/mm$^2$ | 3000 A/mm$^2$ |

EXAMPLE 6

The relations between the density and critical current density of MgB$_2$ superconductor in the superconducting wires produced in example 1 were considered. The results are shown in Table 6. In addition, the density of MgB$_2$ superconductor is a value with respect to the theoretical density, and represented by percentage. The density of MgB$_2$ superconductor also adjusted by adjusting the reduction of the wire. In this example, the density when powder was filled, was adjusted so as to be 50% of the theoretical density. The measurement of the critical current density was performed at a temperature of 4.2 K, and in a magnetic field of 0.5 T.

As is clear from Table 6, if the density of MgB$_2$ superconductor in a superconducting wire is above 90% with respect to the theoretical density, the critical current density increased largely.

TABLE 6

| density of superconducting material | 40 | 60 | 75 | 83 | 86 | 90 | 92 | 98 |
|---|---|---|---|---|---|---|---|---|

TABLE 6-continued

| critical current density (4.2 K, 0.2 T) | 300 A/mm² | 800 A/mm² | 1400 A/mm² | 1850 A/mm² | 2200 A/mm² | 3400 A/mm² | 3600 A/mm² | 3450 A/mm² |
| --- | --- | --- | --- | --- | --- | --- | --- | --- |

Moreover, from the experiments thereafter, it was confirmed that, even when powder producing condition, adding condition of additive element such as indium, copper, and tin, processing condition of wire, and heat processing condition, and the like, are different, if the density of $MgB_2$ superconductor in the superconducting wire is above 90% with respect to the theoretical density, the critical current density increases largely.

In addition, as the result of performing observation of cross section of each wire by a scanning electron microscope, for $MgB_2$ superconductor having a density above 90%, the denseness of the superconducting core part increased, and the bondability between crystal grains improved. Therefore, it is considered that increase of the density of $MgB_2$ superconductor is a main factor to increase the critical current density.

EXAMPLE 7

Figure 5:
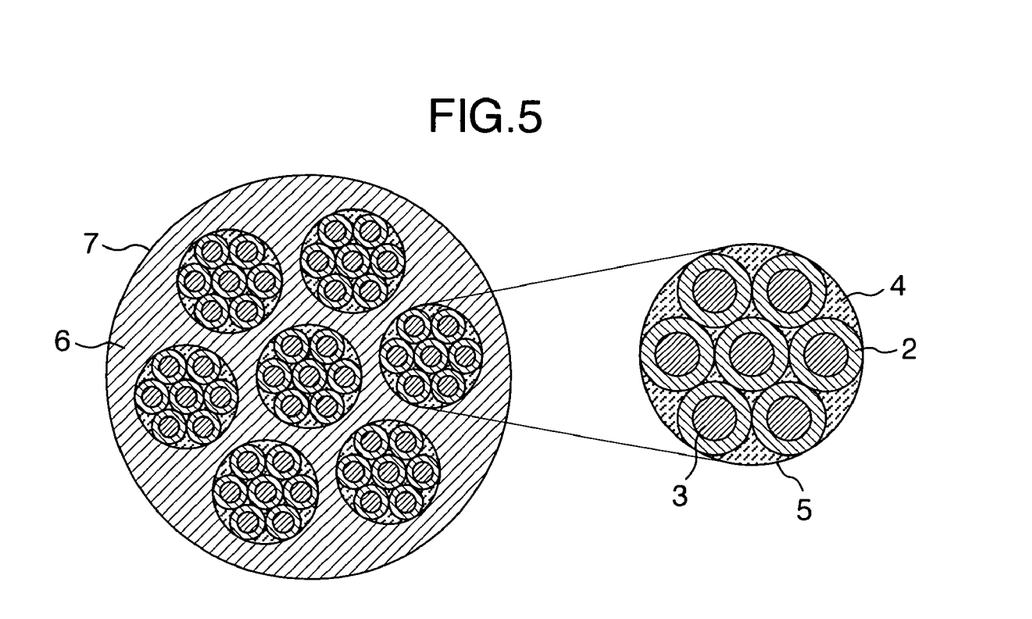
FIG. 5 is a schematic sectional view of the superconducting multicore wire according to the example of the present invention.

Using forty nine superconducting wires produced in similar steps to those of in example 1, a superconducting multicore wire 6, shown in FIG. 5, was produced. When the multicore wire was produced, first, the superconducting wires including $MgB_2$ produced by the method of example 1, which are first metal sheathes, were inserted in a copper round rod 4 with seven holes for inserting the superconducting wire, and the set of seven wires was subjected to twist processing to produce a twisted wire 5. Twist pitch at that time was 25 mm. Next, the twisted wire 5 subjected to the twist processing was assembled in a multicore metal sheath 6, which is second metal sheath. The multicore metal sheath are also provided with holes for inserting the twisted wire 5. The inner surface of the multicore metal sheath material was hardened by radical nitriding. When the twisted wire was assembled in the multicore metal sheath, there was spacing between them, however, after then, they were unified by performing wire drawing.

According to this example, a superconducting multicore wire 7 with forty nine cores structure having an outer diameter of 1.2 mm, could be manufactured without occurring defect such as breakage.

When the critical temperature of the superconducting multicore wire 7 was measured by four-terminal method, it was known that it became in a superconducting state at 37 K. As the result of measurement of the critical current density at a temperature of 4.2 K, and in a magnetic field of 0.5 T for the forty nine superconducting wires, the value of 2900 A/mm² or more was attained for respective wires.

Figure 6:
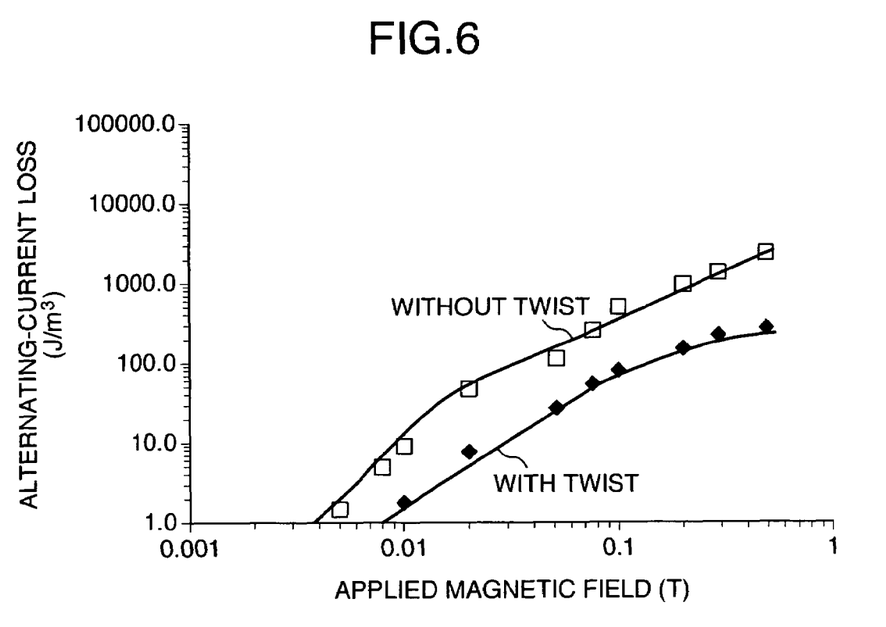
FIG. 6 is a view showing the relations between applied magnetic field and AC loss of the superconducting multicore wires with twist and without twist.

Next, AC loss of the superconducting multicore wire 7 was measured in a magnetic filed. For comparison, similar measurement was performed to a superconducting multicore wire which was not twisted. At that time, the applied field was 0.005-0.5 T, and the frequency was 50 Hz. The results were shown in FIG. 6. As is clear from FIG. 6, it was known that AC loss of the twisted superconducting multicore wire reduced approximately to 1/10 of that of the untwisted superconducting multicore wire. In this example, the number of cores was 49, however, the number can be changed arbitrary.

As mentioned above, for AC application, it was known that by using a superconducting wire twisted in the longer direction of the wire in a cross section of a core, the total AC losses reduced significantly.

The wire of the present invention can be widely applied to superconducting equipment such as large-size magnet, a nuclear magnetic resonance analysis system, a clinical magnetic resonance imaging system, a superconducting energy storage system, a magnetic separation system, a single crystal pulling apparatus in a magnetic field, a refrigerator-cooled superconducting magnet system, a magnetic levitated train, or the like, and it is possible to achieve a high efficiency of equipment.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A metal sheath magnesium diboride superconducting wire comprising a metal sheath and a superconductor comprising magnesium diboride included in the metal sheath, wherein a diffusion hardened layer is formed on an inner surface of said metal sheath, a material of said metal sheath comprises chromium molybdenum steel and said diffusion hardened layer comprises a nitrided or carburizing treated layer of said chromium molybdenum steel or a material of said metal sheath comprises stainless steel and said diffusion hardened layer comprises a nitrided or carburizing treated layer of said stainless steel, and at least an outer surface of said metal sheath has a Vickers hardness of 400 or less at a stage before wire drawing.

2. The metal sheath magnesium diboride superconducting wire according to claim 1, wherein said diffusion hardened layer comprises a nitrided layer.

3. The metal sheath magnesium diboride superconducting wire according to claim 1, wherein said material of said metal sheath comprises chromium molybdenum and said diffusion hardened layer comprises a nitrided or carburizing treated layer of said chromium molybdenum steel.

4. The metal sheath magnesium diboride superconducting wire according to claim 1, wherein said superconductor, and at least one species selected from the group consisting of copper, indium, tin, lead, iron, aluminum, magnesium, titanium, tungsten, silicon oxide, silicon carbide, and silicon nitride, are included in said metal sheath.

5. The metal sheath magnesium diboride superconducting wire according to claim 4, wherein said at least one species selected from the group consisting of copper, indium, tin, lead, iron, aluminum, magnesium, titanium, tungsten, silicon oxide, silicon carbide, and silicon nitride, is included within a range of 0.2-30 vol %.

6. A superconducting multicore wire in which a twisted wire is made by twisting a plurality of the superconducting wires according to claim 1 to provide a plurality of twisted wires, and wherein the plurality of the twisted wires are further included in a second metal sheath.

7. The superconducting multicore wire according to claim 6, wherein the hardness of an inner surface of said second metal sheath is larger than that of an outer surface.

8. The metal sheath magnesium diboride superconducting wire according to claim 1, wherein said diffusion hardened layer comprises a carburizing treated layer.

9. The metal sheath magnesium diboride superconducting wire according to claim 1, wherein said material of said metal sheath comprises stainless steel and said diffusion hardened layer comprises a nitrided or carburizing treated layer of said stainless steel.

* * * * *